United States Patent [19]
Groenewegen et al.

[11] Patent Number: 5,407,505
[45] Date of Patent: Apr. 18, 1995

[54] METHOD OF ENCAPSULATING TEMPERATURE SENSITIVE DEVICES IN WAX-LIKE MATERIAL HAVING A HIGH COEFFICIENT OF FUSION

[75] Inventors: Johannes B. Groenewegen; Ismael Cruz; Richard A. Olzak, all of Kirkland, Wash.

[73] Assignee: AlliedSignal Inc., Morris Township, Morris County, N.J.

[21] Appl. No.: 47,607

[22] Filed: Apr. 13, 1993

Related U.S. Application Data

[63] Continuation of Ser. No. 809,043, Dec. 16, 1991, abandoned, which is a continuation of Ser. No. 613,417, Nov. 14, 1990, abandoned.

[51] Int. Cl.6 ............................................. B29C 45/14
[52] U.S. Cl. .................................... 156/153; 264/162; 264/272.11; 264/272.12; 264/272.17; 264/328.4; 264/328.5; 264/294
[58] Field of Search .............. 264/162, 272.11, 272.17, 264/272.12, 328.4, 328.5, 294; 156/153

[56] References Cited

U.S. PATENT DOCUMENTS

| | | | |
|---|---|---|---|
| 4,460,537 | 7/1984 | Heinle | 264/272.17 |
| 4,569,814 | 2/1986 | Chong et al. | 264/272.17 |
| 4,694,119 | 9/1987 | Groenewegen | |
| 4,927,590 | 5/1990 | Poelzing | 264/328.5 |
| 4,944,401 | 7/1990 | Groenwegen | 220/429 |

FOREIGN PATENT DOCUMENTS

| | | | |
|---|---|---|---|
| 61-85830 | 5/1986 | Japan | 264/328.5 |

*Primary Examiner*—Jan H. Silbaugh
*Assistant Examiner*—Angela Ortiz
*Attorney, Agent, or Firm*—Howard G. Massung

[57] ABSTRACT

A method of encapsulating temperature-sensitive electronic devices such as solid state memory devices used in aircraft for recording flight data and the like in a wax-like material having a high heat of fusion to establish a heat sink for protecting the device against intense heat resulting from fire includes the preparation of a wax "preform" under heat and pressure in a closed chamber for minimizing oxidation thereof and thereafter transferring the preform by the application of heat and pressure to move the material in a softened condition into a mold cavity supporting the memory devices and forming the material to encapsulate a printed circuit board, carrying memory devices to exclude air and protect the same from deleterious effects of intense heat.

24 Claims, 3 Drawing Sheets

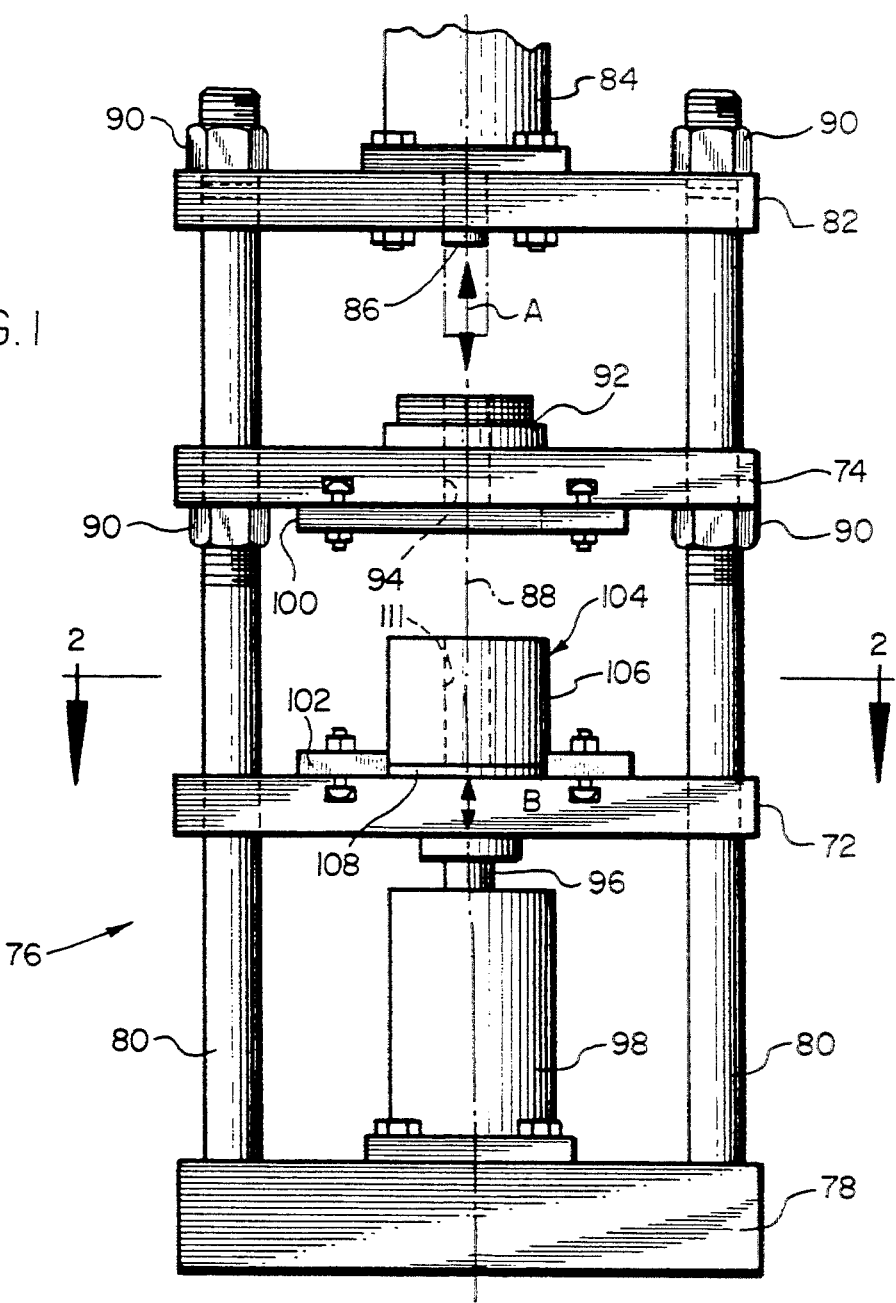
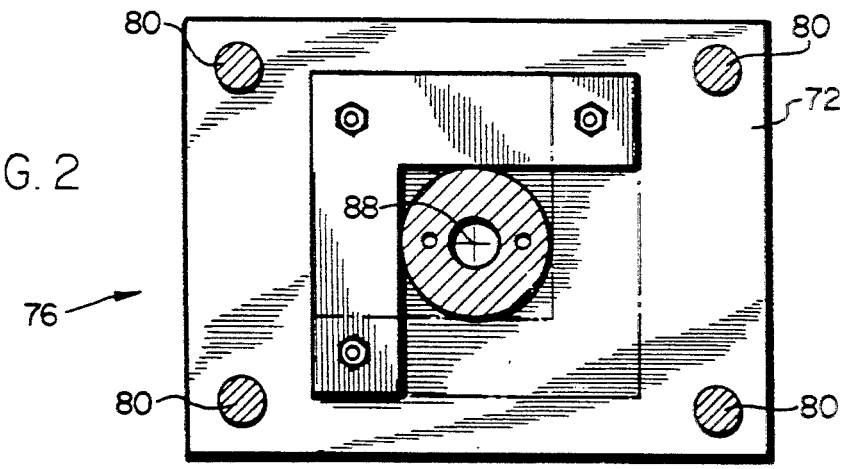

METHOD OF ENCAPSULATING TEMPERATURE SENSITIVE DEVICES IN WAX-LIKE MATERIAL HAVING A HIGH COEFFICIENT OF FUSION

This application is a continuation of application Ser. No. 07/809,043, filed Dec. 16, 1991, now abandoned, which is a continuation of Ser. No. 07/613,417 filed Nov. 14, 1990, now abandoned.

BACKGROUND OF THE INVENTION

1. Field of the Invention

The present invention relates to a new and improved method of encapsulating temperature sensitive electronic devices in a wax-like material having a high coefficient of fusion so as to provide a heat sink for protecting the temperature sensitive electronic devices against intense heat. Solid state memory devices are commonly used in aircraft for storing data and protective enclosures are provided for these devices which are designed to survive aircraft accidents, crashes, fires, etc. in order to preserve the stored data so that accident investigators may have a useful bank of information available to determine the cause of the aircraft accident or crash.

In the context of this disclosure, a "solid state memory" or "a solid state memory module" may comprise a total assembled "end product" commonly termed in military nomenclature as a CSMU standing for Crash Survivable Memory Unit. Individual "chips" in these memories comprise "memory devices" such as an EEPROM, "flash" memory and other types of devices. Chips are usually mounted on PC boards (printed circuit boards), encapsulated in wax, and surrounded by a fiberglass (or other) container, with a flex-print cable connected thereto and the assembly is referred to as a "wax filled memory module" (WFMM).

2. Description of Pertinent Art

U.S. Pat. No. 4,694,119 discloses a solid state memory contained in a small crash protective container including a device encapsulating, heat sink formed of synthetic amide wax designed to protect electrically erasable programmable read only memory (EEPROM or other solid state) devices from damage due to heat and fire.

U.S. Pat. No. 4,944,401, issued Jul. 31, 1990, for a CRASH SURVIVABLE ENCLOSURE FOR FLIGHT RECORDER discloses a solid state memory device carried in a crash survivable flight data recorder system containing an organic wax or wax-like material of a type known as HM 23 or ACRAWAX, manufactured by GLYCO, INC. of Greenwich, Conn., and having a relatively high heat of fusion so as to provide a heat sink for the protection of the solid state memory device and circuit board that is contained in a crash protected enclosure.

The present invention is directed toward a new and improved method for encapsulating electronic devices of the character described in a synthetic wax or wax-like material or similar substance having a relatively high heat of fusion to provide a heat sink for absorbing heat for the protection of the memory devices against high temperature and fire commonly encountered in aircraft crashes.

OBJECTS OF THE INVENTION

It is an object of the present invention to provide a new and improved method of encapsulating a temperature-sensitive solid state device in a mass of synthetic wax material having a relatively high heat of fusion.

Another important object of the present invention is to provide a new and improved method of encapsulating a heat sensitive solid state memory or other device in a mass or slug of synthetic wax and/or wax-like material of the character described, which material has a melting point or fusion temperature that is different than the maximum temperature that can be tolerated by the device being encapsulated.

Another object of the present invention is to provide a new and improved method of the character described wherein a temperature sensitive solid state memory device is not subjected to prolonged temperatures of greater than about 300° F. during the encapsulation process.

Still another object of the present invention is to provide a new and improved method of the character described wherein an encapsulation process takes place at a temperature substantially less than the normal melting temperature of the encapsulating material, which material is molded or shaped to encapsulate the memory or other device while in a softened state between solid and liquid under controlled pressure and flow to enclose the solid state memory devices and thereby exclude air and air pockets from around the memory devices.

It is an object of the present invention to provide a new and improved method of the character described for optimum protection of a memory device by establishing intimate surface contact between the surfaces of the memory devices and a mass of synthetic wax material encapsulating the same.

Another object of the present invention is to provide a new and improved method of the character described which insures that voids or empty air spaces are minimized in an encapsulating mass of wax material after the memory devices are encapsulated therein.

Another object of the present invention is to provide a new and improved method of the character described which insures that cracking or splitting of an encapsulating mass after solidification occurs is minimized.

Yet another object of the invention is to provide a new and improved method of the character described which does not expose a solid state memory device to otherwise potentially damaging high temperature normally associated with the melting temperature of a synthetic wax material used for encapsulation.

Another object of the invention is to provide a new and improved method of the character described which insures that hydraulic pressures developed during a transfer of synthetic wax preform into a forming mold around a memory device is carried out in a manner that eliminates or greatly reduces the risk of physical damage or distortion of the memory devices and/or circuit boards on which they are mounted.

Yet another object of the present invention is to provide a new and improved method of the character described which insures that a uniform and precisely dimensioned mass of protective wax material is encapsulated around solid state memory devices and fits snugly into a preformed container or shell with a minimum of additional handling.

Yet another object of the present invention is to provide a new and improved method of the character described wherein an encapsulated solid state memory device is manufactured in a manner providing a trouble free and long useful life for a memory device and which is capable of withstanding aircraft crashes, fire and high temperatures associated therewith to meet the requirements of a EUROCAE specification (ED-55) for minimum operational performance requirements for flight data recorder systems.

BRIEF SUMMARY OF THE INVENTION

The foregoing and other objects of the present invention are accomplished in a new and improved method of encapsulating a solid state memory device in a mass of synthetic wax or wax-like material having a high heat of fusion for establishing a heat sink around the memory device for protecting the same against fire and heat damage in the event of an aircraft accident or crash. In accordance with the method of the invention, a measured amount of synthetic wax material of the type having a relatively high heat of fusion is preformed into a slug or mass at a temperature substantially less than the melting or fusion temperature thereof, so as to provide a cylindrically-shaped, air free slug of material that is not subjected to any substantial oxidation during a preheating period and subsequent forming process. Thereafter, the pre-formed heated slug is transferred under pressure into a mold containing a solid state memory device which is to be protected.

The transfer process is performed at an elevated temperature under suitable high pressure conditions so as to closely conform to and surround the memory device providing an air free interface. Because of the temperature selected, the wax-like material assumes a softened state between a solid and liquid condition during the molding process even though the temperature is maintained at approximately 300° F. which is low enough to preclude any heat damage to the memory device, yet considerably less than the normal melting or fusion temperature of the synthetic wax which is about 450° to 470° F. This lower temperature of approximately 300° F. does not cause any damage to the electronic components or EEPROM or flash memory devices contained on a circuit board of the solid state memory device contained in the forming mold. After the wax-like material has cooled significantly, the encapsulated memory device is removed from the mold, any voids in the body are filled with wax and the wax body is precisely dimensioned so as to fit tightly in a preformed, fiberglass protective container or shell which is sealed to exclude air and provide an air free protective wax enclosure around the solid state memory device. The encapsulating mass of synthetic wax material has a high heat of fusion and forms a heat sink to absorb external heat and thereby protect the memory device against damage from high temperatures, heat and fire in the event of an aircraft crash. The flight data contained and stored in the encapsulated memory device is thus preserved and available for review by accident investigators to aid in determining the cause of the accident.

BRIEF DESCRIPTION OF THE DRAWING

For a better understanding of the present invention, reference should be had to the following detailed description taken in conjunction with the drawings, in which:

FIG. 1 is a side elevational view of a hydraulic press used in the practice of the method of the present invention;

FIG. 2 is a horizontal, transverse, cross-sectional view taken substantially along lines 2—2 of FIG. 1;

DETAILED DESCRIPTION OF THE INVENTION

Referring now more particularly to the drawings and to U.S. Pat. Nos. 4,694,119 and 4,944,401, both of which are incorporated herein by reference, the present invention is directed towards a method of encapsulating a solid state memory device 10 within a body or mass 12 (FIG. 7) of synthetic wax and/or wax-like material of the type described in the aforementioned U.S. Patents.

Figure 7:
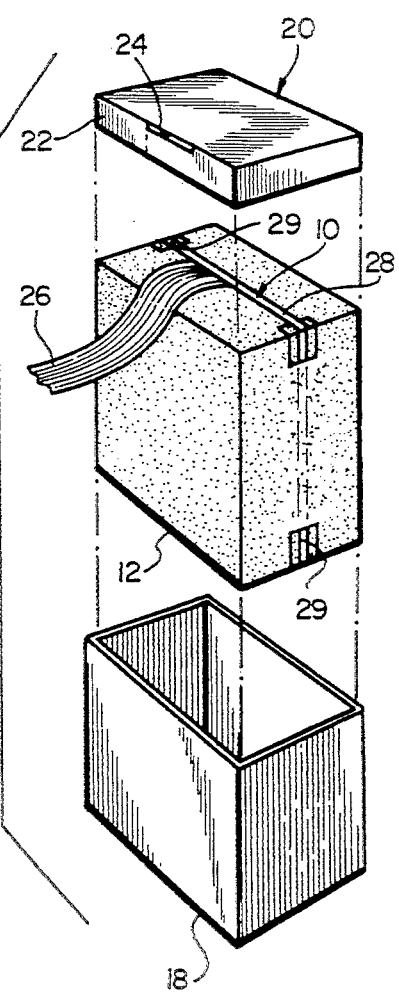
FIG. 7 is an exploded perspective view of a completed encapsulated solid state memory device ready for insertion and sealing within a fiberglass box-like enclosure.

The body 12 of wax-like material is generally rectangular or block-shaped as illustrated in FIG. 7. The encapsulated memory device is designed to fit within a protective shell or box-like container 18. The container is preferably formed of fiberglass reinforced plastic resin and includes a lid 20 having a downwardly depending peripheral edge wall 22 formed with an elongated slot 24 on one side in order to accommodate a ribbon-like sheath or a "flex-print" connecting strip 26 of the solid state memory device 10 for enabling the input and output of data and information for storage and retrieval in devices such as EEPROM's or like solid state memories.

The solid state memory module 10 includes a circuit board 28 of rectangular shape having a plurality of electronic memory devices such as EEPROM's 30 and includes printed circuits 32 on opposite faces thereof. Thus, opposite faces of the circuit board 28 (FIG. 6) are somewhat irregular in contour and it is desirable to have the body of wax-like material 12 formed to closely conform to these irregular contoured surfaces so that air volume is minimized and a maximum heat sink effect can be obtained for the best protection of the solid state memory devices 10.

In accordance with the present invention, the memory module 10 is mounted in a forming mold 34 (FIGS. 5 and 6) of generally rectangular shape and provided with relatively thick, strong walls to withstand clamping forces of 7 tons and greater.

Figure 5:
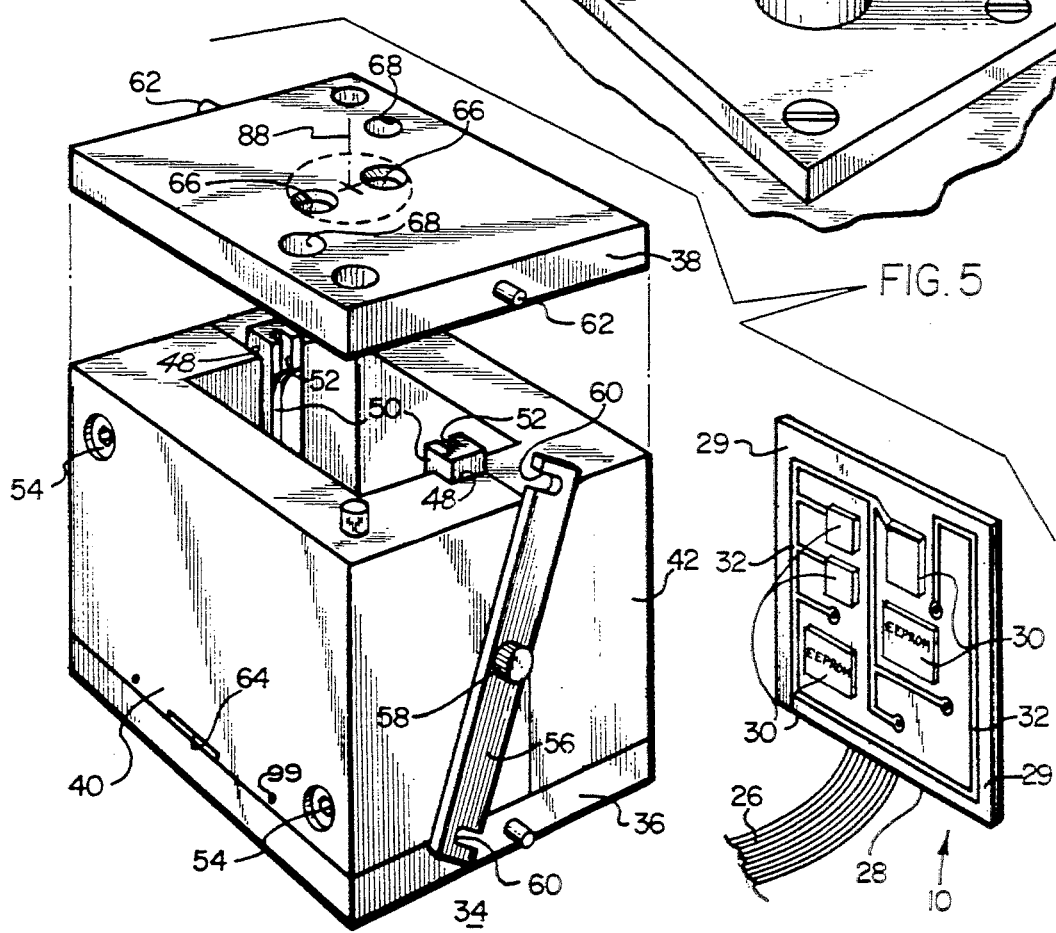
FIG. 5 is an exploded perspective view of forming mold used for encapsulating a solid state memory device in a body of wax-like material in accordance with the method of the invention.

Referring specifically to FIG. 5, the forming mold 34 includes a rectangular bottom plate 36, a top plate 38 of matching size and shape, a pair of opposite half members having sides 40 and 42 provided with a groove 48 along an inner edge joining the adjacent end plate to provide a vertically extending guideway for receiving a removable, elongated edge guide 50 having an elongated groove 52 on the inner face for receiving an adjacent edge portion 29 of the circuit board 28.

Each end wall of the mold 34 is provided with a locking lever 56 secured to pivot on a cap screw or pivot pin 58 mounted on an end plate of the half members 40 and 42. The locking levers have a pair of slots 60 adjacent opposite ends which are adapted to engage pins 62 projecting outwardly from opposite edges of the bottom plate 36 and the top plate 38. After assembly of the mold 34, the locking levers 56 are pivoted into a vertical position, thus additionally securing the top and bottom plates to the side walls and end walls of the forming mold 34. The lower edge of the side wall 40 is formed with a slotted out segment 64 in order to accommodate the flex print connector 26 of the solid state memory device 10. The slot 64 is provided with a resilient cushion pad 125 (FIG. 6) to preclude damage to the flex-print connector 26 when the bottom plate 36 is secured to the underside of the mold body. The upper wall 38 of the mold 34 is formed with a pair of fill openings 66 on opposite sides of a central axis extending between the pins 62. Each fill opening communicates with mold cavity 41 or 43 on opposite sides of the solid state memory device 10 (FIG. 6) and the cavities are simultaneously filled with wax-like material in a softened state or condition between solid and liquid during the molding process. The bottom and top plates 36 and 38 of the mold 34 are formed with locating recesses 68 for accurately positioning the mold 34 during the mold filling operation and the recesses are engaged by headed locating pins 70 as best shown in FIG. 6.

Figure 6:
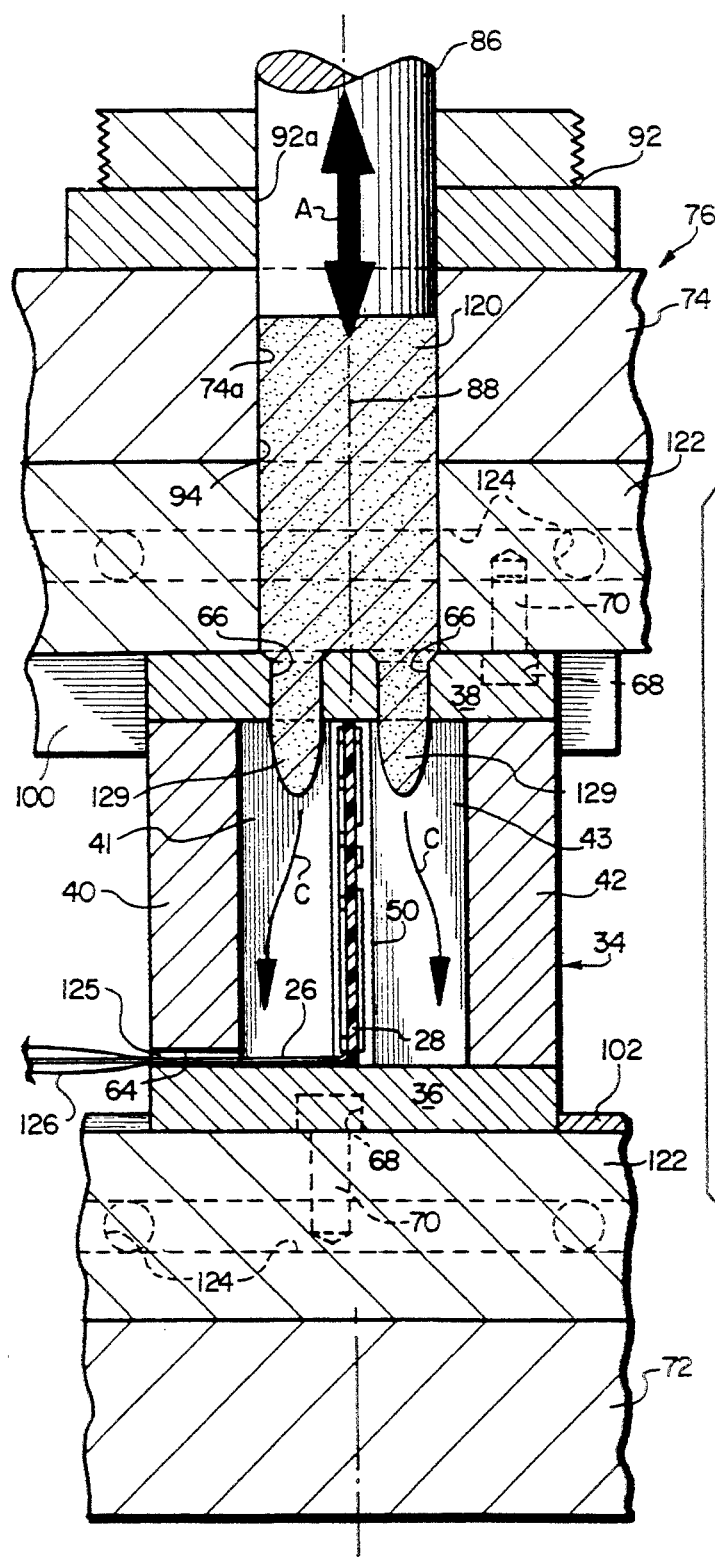
FIG. 6 is an enlarged vertical cross-sectional view illustrating the formation of an encapsulating mass of wax material around a solid state memory device mounted in the forming mold while clamped in place on the hydraulic press during a mold filling operation.

In accordance with the invention, the forming mold 34 is adapted to be clamped between a lower, vertically movable platen 72 and a normally fixed but adjustable level, upper platen 74 of an upstanding hydraulic press 76, illustrated in FIGS. 1, 2 and 6. The hydraulic press 76 includes a horizontal base structure 78 of rectangular profile supporting a plurality of upstanding rods or posts 80 extending upwardly from corner locations on the base as best shown in FIG. 2.

At the upper end, the press 76 is provided with an upper cylinder support plate 82 which carries an upper, hydraulic cylinder 84 provided with a ram 86 movable vertically along a central axis 88 midway between the four posts 80 as indicated by the double headed arrow A. The upper platen 74 can be moved to selected different levels relative to the base 78 and once a desired level is attained, the platen 74 is supported on a plurality of leveling nuts 90 in threaded engagement with the respective corner posts or rods 80.

On the upper surface of the upper platen 74, there is provided a circular ring element 92 having a central bore 92a aligned on the axis 88 and a matching diameter bore 74a is provided in the upper platen to define a cylindrical transfer chamber 94 having a diameter closely matching the outer diameter of the ram 86 which is movable into and out of the transfer chamber to transfer material from the transfer chamber under pressure to an awaiting mold 34 clamped below the upper platen 74.

The lower, movable platen 72 is supported and secured to the upper end of a lower hydraulic ram 96 of a lower, hydraulic cylinder 98 which is mounted on the base structure 78 in coaxial alignment with the central axis 88. Thus the lower cylinder 98 and ram 96 is activated to raise and lower (arrow B) the level of the movable platen 72 relative to the normally fixed level of the upper platen 74 to clamp the mold 34 in place. The upper cylinder 84 and the ram 86 is movable into and out of the transfer chamber 94 to transfer the contents thereof into the mold that is clamped between platens 72 and 74.

Referring to FIGS. 1 and 2, the hydraulic press 76 is provided with upper and lower locating plates 100 and 102 of generally L-shaped configuration as shown in FIG. 2 attached to the respective upper and lower platens 74 and 72 in a conventional manner. The locating plates 100 and 102 are adapted to precisely position and center a cylindrically-shaped preform mold 104 best shown in FIGS. 3 and 4. The mold 104 includes a hollow, cylindrically-shaped body 106 having a relatively thick wall to withstand high molding pressure. The mold body 106 is closed at the lower end by a removable, circular bottom plate 108 secured to the body by a plurality of cap screws 110. At the upper opposite end, the preform mold 104 is left open during molding operations to expose a central cylindrical cavity 111 having a diameter that is dimensioned to match the diameter of the transfer chamber 94.

After filling with wax material, the upper end of the mold 104 is closed with a circular top plate 112 also secured in place on the body 106 by a plurality of cap screws 110. When the top plate 112 is in place, the interior of the bore of the mold body 106 is sealed off to protect the mass of synthetic wax-like material contained therein against oxidation during a preheating period. This wax material is used to ultimately form the body of wax material 12 for encapsulating the printed circuit board mounted, solid state memory devices 10.

In accordance with the present invention, synthetic organic amide wax materials of the type set forth in the aforementioned U.S. Pat. No. 4,694,119 (incorporated herein by reference) are initially obtained in particulate form and the particles approximate the size and consistency resembling crushed rock. The hydraulic press 76 and transfer chamber 94 is thoroughly cleaned after each molding operation and the press is opened up by lowering the platen 72 for a visual inspection of the upper and lower platens for any remaining residue or the like from the previous molding operation. Any such residue is scraped off with a metal scraper and the platen surfaces are thoroughly cleaned using compressed air supplied from a flexible air hose to blow away any loose material.

The upper and lower, L-shaped locating plates 100 and 102 are secured to the respective upper and lower platens 72 and 74 by the use of T nuts or the like and the T-nut screws are initially hand tightened only. The preform mold 104 is then partially assembled with the bottom circular wall 108 attached to the hollow, thick walled cylindrical body 106 utilizing cap screws 110 to secure the bottom wall in place. The partially assembled preform mold 104 is preheated to approximately 300° F. and then is positioned on the lower platen 72 against the lower locating plate 102 as shown in FIG. 2 so that the central axis of the mold cavity 111 is precisely aligned with the vertical axis 88 of the hydraulic press 76 and the rams 86 and 96 of the respective hydraulic cylinders 84 and 98.

When proper alignment is achieved, the lower locating plate 102 is tightly secured in place. The press 76 is then set up for manual operation and the platens 72 and 74 are heated and maintained at a temperature of approximately 300° F. The desired hydraulic clamping pressure is then set up on the control of the press 76 and the "close clamp" button is activated so that the lower platen 72 moves upwardly to press the upper, open end of the cylindrical body 106 of the mold 104 against the underside of the upper platen 74.

The upper ram 86 is retracted upwardly into the upper hydraulic cylinder 84 and the transfer cavity 94 in the upper platen 74 and ring 92 is checked for precise centered coaxial alignment with the mold cavity 111 of the clamped-in-place mold body 106. The upper end of the mold body 106 is maintained in an accurately aligned position against the upper locating plate 102 and the mold 104 is tightly clamped between the upper and lower platen 74 and 72 once precise alignment is achieved with the transfer cavity 94 and mold cavity 111 in coaxial alignment.

A predetermined volume of wax is obtained by compressing the crushed rock-like particles of raw wax in a preform mold with the use of a hydraulic ram to exclude the entrapped air, thereby producing a homogeneous preform cylinder of predetermined size. The amount of downward travel of the ram 86 is carefully controlled for depth of insertion and, the hydraulic pressure applied is set for a value between 5 and 6 tons pressure and held for 2 to 3 minutes while the wax is being compressed.

Minor escapement of wax material from the mold 104 is normal under the high pressures utilized and the high pressure exerted on the wax particles is effective to completely compress a larger volume of the gravel-like particles in the transfer chamber 94 into the smaller volume cavity of the preform mold 104. After compression, the upper level of the wax material is approximately even with the upper level of the mold body 106. The pressure exerted by the ram 86 is then lowered to 3 tons or below and the ram 86 is raised to a level well clear of the ring 92 on the upper platen 74. The lower clamping cylinder 94 is then energized to lower the ram 96 and the lower platen 72 to release clamping pressure on the preform mold 104.

The filled preform mold 104 is closed with the circular top plate 112 assembled onto the mold body 106 and secured in place by cap screws 110. The filled mold 104 and wax contents are then placed in an oven preheated to 300° F. and are retained in the oven for approximately 3 hours.

In the meantime, the open hydraulic press 76 is again cleaned and made ready for use with the rectangular, module forming mold 34. The upper hollow cooling plate 122 is secured to the upper locating plates 100 and 102 and/or platens 72 and 74 as best shown in FIG. 6. Cooling plate 122 is provided with a plurality of cooling water passages 124 in the interior thereof and these passages are connected to a ready source of cooling water and a drain line is provided for exhaust of spent cooling water used for reducing the temperature of the forming mold 34 down to approximately 250° F. after the molding operation has been completed. The cooling plates 122 are provided with strategically located, headed locator pins 70 as shown in FIG. 6 for precisely positioning the forming mold 34 and the heads of the pins 70 are seated within the locator openings 68 provided in respective top and bottom plates 38 and 36 of the mold 34.

The mold 34 is assembled ready to receive the wax material by securing the side plates 40 and 42 to the end plates 44 and 46 of the end walls utilizing cap screw 54. The guides 50 are then inserted into the grooves 48 in the respective end plates 44.

The top and bottom plate 38 and 36 are then assembled onto the assembled body of side plates and end plates of the mold 34 and the partially assembled mold 34 is then positioned adjacent the lower locating plate 34 on the lower platen 72 with the headed pins 70 on the lower cooling plate 122 seated in the recesses 68 provided plate 36.

To line up the mold 34 on center line 88 of transfer ram 86, the lower hydraulic cylinder 98 of the hydraulic press 76 is activated to raise the lower platen 72 to move upwardly and clamp the partially assembled mold 34 in a centered position between the upper platen 74 and the lower platen 72. The clamping pressure is adjusted until approximately 7 tons of pressure is attained and then the hydraulic press is opened by lowering the platen 72 until the mold 34 is well clear of the upper water cooling plate 122. This set up is done only one time and once a proper alignment is obtained, the procedure is not repeated for each successive molding operation.

The partially assembled mold 34 is then removed from the hydraulic press 76 and placed on a convenient workbench with the top plate 38 facing downwardly. Before inserting the PC board carrying the solid state memory devices 10 into place in the partially assembled mold 34, the person working with the mold and the memory device 10 attaches a ground strap to his wrist, and the PC board assembly 10 is then removed from a protective ESD shielding bag. A smaller bag 126 of ESD shielding material is then placed over the flex print connector 26 and retained in place with staples. The top plate 38 and bottom plate 36 are then removed from the body of the forming mold 34 and the edges 29 of the circuit board 28 carrying the solid state memory devices 10 are inserted into the grooves 52 of the respective edge guides 50.

In accordance with the invention, the mold operator always uses a grounding strap on his wrist before handling the PC board with memory devices 10 in order to preclude a charge of static electricity from damaging the components, EEPROM's or "flash memory" 30 during assembly into the mold 34. The edges 29 of the circuit board 28 are carefully inserted in the grooves 52 of the respective guides 50 and the circuit board is moved into the mold cavity to the position shown in FIG. 6 dividing the mold cavity into separate compartments or cavities 41 and 43 facing opposite sides of the circuit board.

The ribbon-like flex print connector 26 is positioned to lie adjacent the lower edge level of the side wall 40 having the slot 64 formed therein. A resilient silicon rubber cushion 125 is then placed in the slot 64 and the flex print connector 26 is extended outwardly through the slot to the outside of the side wall 40. This is accomplished while the lower edges of the side wall 40 and 42 and the end plates 44 and 46 facing upwardly and with the protective plastic ESD shielding bag 126 in place to enclose and cover the outwardly extending portion of the flex print connector 26 so that damage to the connector does not occur.

The flex print ribbon connector 26 is carefully aligned with the slot or notch 64 of the mold side wall 40 as shown in FIG. 6 and the pre-cut silicon rubber seal 125 is placed in the notch below the flex print ribbon connector 26 before the bottom cover 36 is installed and secured to the guide walls 40, 42, and end wall plates 44 and 46 with the cap screws 54.

The mold 34 is then turned right side up so that the flex print ribbon connector 26 is located at the bottom of the mold 34 and care is taken to insure that the ribbon connector 26 is maintained in a centered position in the slot 64 so that the silicon rubber seal 125 is effective to seal off both side edges of the ribbon connector when the mold is closed.

The locking levers 56 are then pivoted on the central pivot axles or pins 58 until the slots 60 of the levers lockingly engage the pins 62 on the top and bottom plates 36 and 38. The completed mold 34 with a solid state memory device 10 mounted therein is then placed in a molding position on the open hydraulic press 76 with the flex print connector 26 adjacent the bottom platen 72. A piece of heat insulating protective material is placed under the ESD bag 126 to protect both the bag and the connector 26 from the heat of the platen 72 which is maintained at about 300° F.

The hydraulic press 76 is then activated to clamp the mold 34 tightly between the platens 72 and 74. When the lower cylinder 98 is activated to move the lower platen 72 upwardly to tightly clamp the mold 34 precise alignment between the center line 88 of the transfer cavity 94 in the upper platen 74 and the center of the mold 34 between the filling holes 66 is achieved. As the hydraulic press 76 is closed to clamp the mold 34, care is taken to insure that proper alignment between the locating pins 70 and the openings 68 in the upper plate 38 is attained before maximum pressure is exerted. The clamp pressure is increased to approximately 7 tons. A hand held pyrometer is used to determine the temperature of the mold and a thermometer probe is placed onto a surface of the mold 34 to verify when the mold temperature reaches approximately 300° F.

Figure 3:
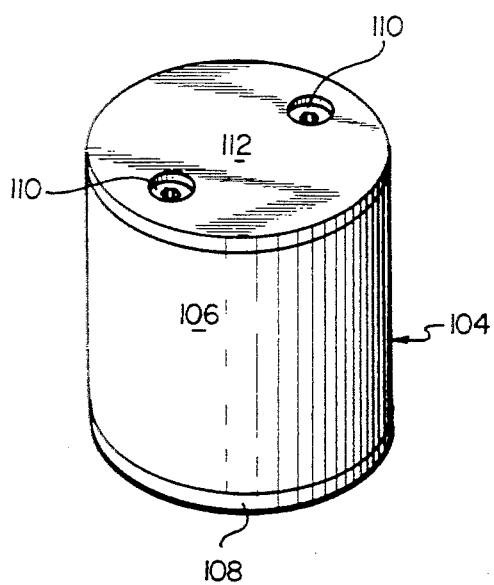
FIG. 3 is a perspective view, of a cylindrical mold used for forming a measured volume of wax-like material into preformed cylindrical slug or body in accordance with the present invention.
Figure 4:
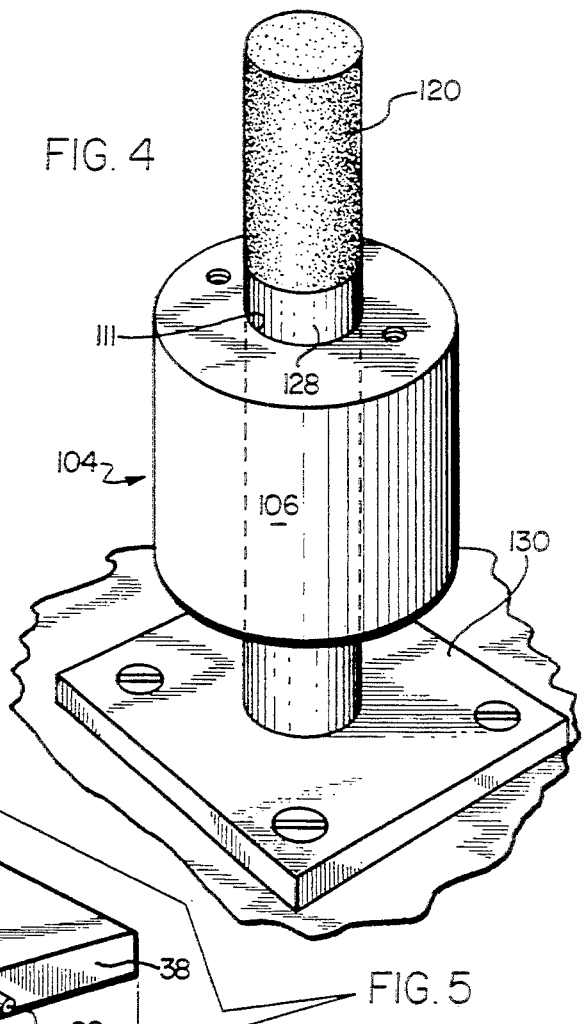
FIG. 4 is a perspective view illustrating the preformed body of encapsulating wax material during ejection from the mold with the aid of an ejection fixture.

In the meantime, the preform mold 104 and the wax material contained therein has reached and been stabilized over a period of several hours at a temperature of approximately 300° F. This temperature is substantially less than the melting or fusion temperature of the wax-like material and low enough to preclude any damage to the solid state memory device 10. The preform mold 104 and contents is removed from the oven and the cover plates 108 and 112 are disassembled from the cylindrical body 106 by removal of the cap screws 110 as shown in FIG. 3. Referring momentarily to FIG. 4, after the cover plates 108 and 112 have been removed from the body 106, the preformed mold body 106 is placed on an upstanding cylindrical ejection post 128 and is moved downwardly thereon to eject a cylindrical slug or body 120 of wax material contained in the mold body 106. The post 128 of the jig is secured to a suitable base plate 130 mounted on a bench surface or the like as shown in FIG. 4 and the ejection post is thus maintained in a stable, upright position as the completed solid slug 120 of wax-like material is pushed out of the upper end of the mold body 106.

As rapidly as possible, the preform wax is taken from the mold 104, and placed in the transfer cavity or chamber 94 formed in the upper platen 74 and the ring 92 as best shown in FIG. 6. After the slugs 120 of preformed wax material are positioned in the transfer cavity 94, the upper hydraulic cylinder 84 is activated to lower the ram 86 downwardly and as the lower surface of the ram 86 engages the uppermost slug 120 of wax-like material, the material is changed into a state between liquid and solid or paste-like consistency and is extruded downwardly under low pressure (approximately ½ ton) through the pair of precisely formed spaces 66 formed in the top plate 38 in communication with respective half chambers 41 and 43 defined on opposite sides of the circuit board 30 in the forming mold 34.

Even though the temperature of the solid wax preform 120 is only approximately 300° F. (some 80° F. below the melting or fusion point of the material), because of the application of pressure and the controlled consistency of the heated wax-like material, in a paste-like (softened wax) state is obtained and this material (129 in FIG. 6) flows downwardly as indicated by the arrows "C" to completely fill the respective half chambers or cavities 41 and 43 on opposite sides of the circuit board 28 in the mold 34 and is molded to closely conform to the irregular surfaces of the memory device 10. The pressure is maintained by the ram 86 until the wax material is seen to extrude through vent holes 99 provided in a lower portion of the body of the mold 34. The clamping pressure of the hydraulic press 76 on the mold 34 and the molding pressure exerted by the ram 86 on the wax-like material in the mold are maintained at predetermined levels for 2 to 3 minutes and the temperature is maintained at approximately 300° F. during the entire mold filling process.

After a suitable time period has elapsed, the platen temperature controls of the press 76 are reset downwardly to 250° F. and water cooling through the passages 124 of the cooling plates 122 is initiated so that the molded body 12 of wax-like material in the filled mold 34 begins to harden somewhat as the temperature begins to drop down to approximately 250° F. The temperature of the mold and contents is monitored by means of thermocouples (not shown) inserted into the mold 34. A cooling period of approximately one hour is employed prior to removing the module from the mold.

The clamping pressure is maintained until the thermocouple thermometer indicates approximately 250° F. and then the ram 86 is withdrawn upwardly to release the remaining molding pressure while the lower platen 72 is moved downwardly to release the clamping pressure and provide ample space so that the mold 34 can then be easily removed from the hydraulic press. After removal from the hydraulic press 76, the platens 72 and 74 are again supplied with heat to move the temperature back upwardly to approximately 300° F. in readiness for the next molding operation.

The mold operator again secures a grounding strap to his wrist and begins to remove the completed molded module (FIGS. 6 and 7) from the forming mold 34 by first turning the locking levers 56 to the unlocked positions wherein the slots 60 no longer engage the pins 62 on the bottom plate 36 and the top plate 38. Thereafter, the top and bottom plates are removed by loosening of the cap screws 54 and the side plates 40 and 42 are similarly removed after the cap screws are loosened so that the edge guides 50 may be slidably removed out of the slots 48 and subsequently disengages from the opposite edges 29 of the printed circuit board 28. Flexible retainers are placed around the molded body to prevent break-up. The encapsulated module is then allowed to cool to room temperature and shrink to a normal size.

Even though the wax-like material is constantly maintained at a temperature of 300° F. which is well below its melting temperature of approximately 450° F.–475° F., an excellent encapsulation is obtained in accordance with the method as described because of the use of relatively low transfer molding pressures available from the ram 86 acting on the heated material while the heated mold is in place and clamped tightly between the platens 72 and 74. Thereafter, when the mold 34 and wax-like material therein is allowed to cool to 250° F., the solidified material provides an excellent, air-free mass around the encapsulated molded-in-wax, solid state memory device 10 to form a heat sink ready to absorb a large quantity of heat before melting away.

After sufficient cooling, the encapsulated molded module including the solid state memory device 10 and the body halves 14 and 16 of wax-like material 12 are inspected closely and any voids or recesses are manually filled with the same type of wax-like material using a stick of wax and a soldering gun.

Subsequently, the molded modular unit is hand sanded to a dimensionally correct rectangular shape so it will precisely fit into the interior of the protective box-like shell or container 18 as shown in FIG. 7. The sanded modular unit is placed in the shell and the lid 20 is adhesively secured in place after the flex-print ribbon connector 26 is passed out of the sidewall 22 through the slot 24. The completed, shell encased modular unit may then be assembled into a metal protective shell for protection against external physical forces as set forth in the aforementioned U.S. Pat. No. 4,694,119, incorporated herein by reference.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method of encapsulating a finished circuit board having at least one or more temperature sensitive electronic devices mounted thereon which are subject to damage from heat upon reaching a particular temperature level, comprising the steps of:
   initially forming a quantity of particulate, wax material having a high coefficient of fusion and a melting temperature that is greater than said particular temperature level, into a void free preform slug to remove air pockets therefrom by the application of pressure in a preform mold;
   thereafter closing said preform mold with cover means to provide a closed chamber for minimizing oxidation of said preform slug of said material;
   subsequently baking said preform slug of material in said closed chamber for an extended period of time at a predetermined temperature level less than said particular temperature level until achieving substantially a uniform temperature condition throughout said material; and
   thereafter transferring said baked preform slug by the application of pressure into a forming mold having said circuit board supported in a cavity thereof and applying pressure to flow said material into said cavity around said circuit board at a temperature below said particular temperature to encapsulate said circuit board in said material substantially free of air voids.

2. The method of claim 1, including the step of:
   depositing a predetermined amount of said wax material in particulate form into said preform mold which has been preheated to substantially said predetermined temperature level.

3. The method of claim 2, including the step of:
   compressing said particulate form of said material as initially deposited in said preheated preform mold into a solid slug substantially free of voids.

4. The method of claim 3, including the step of:
   heating said solid slug until reaching said predetermined temperature while confined in said closed chamber.

5. The method of claim 1, including the step of:
   placing said preform slug of wax material in a mold transfer cavity in communication with said cavity of said forming mold for movement of said material into said forming mold around circuit board having said temperature sensitive device mounted thereon.

6. The method of claim 4, wherein:
   said predetermined temperature is substantially less than said melting temperature of said wax material.

7. The method of claim 6, wherein:
   said melting temperature is in the vicinity of 380° F. and said predetermined temperature is not substantially greater than 300° F.

8. The method of claim 4, wherein:
   said compressing step is accomplished with a ram movable to close said preform mold.

9. The method of claim 8, wherein:
   said ram is removed from said preform mold after said compressing step is accomplished and said preform mold is closed by securing said cover means in place prior to said baking step.

10. The method of claim 9, wherein:
    said baking step is accomplished away from said ram for an extended period of time.

11. A method of forming a protective body of a particulate, wax material having a high value, heat of fusion and high melting temperature around a heat sensitive electronic device of a type which is subject to damage at a particular temperature level less than said melting temperature, comprising the steps of:
    initially making a void free preform slug of said material having a predetermined volume from a quantity of said material initially introduced into a preform mold while in particulate form by the application of heat and pressure;
    thereafter closing said preform mold by securing a cover over said preform slug;
    subsequently heating said preform mold for an extended period of time with said cover in place at a temperature less than said particular temperature level to achieve a substantially uniform temperature throughout said material until said preform slug is softened into a paste condition; and
    thereafter reshaping said preform slug in a forming mold containing said device by the application of heat and pressure thereafter while said preform slug is still in a paste condition below the critical temperature to form said protective body around said electronic device.

12. The method of claim 11, wherein:
    said preform mold is heated to a predetermined temperature less than said particular temperature level before said material is introduced into said preform mold.

13. The method of claim 12, wherein:
    said predetermined temperature is less than the melting temperature of said wax material.

14. The method of claim 13, wherein:
    said reshaping step is accomplished while said preform slug is maintained at substantially said predetermined temperature.

15. The method of claim 14, wherein:
    said reshaping step is accomplished by the application of ram pressure on said preform slug for forcing said material thereof into a shaping mold containing said electronic device.

16. The method of claim 15, wherein:
said shaping mold and contents are heated to said predetermined temperature.

17. The method of claim 16, wherein:
said shaping mold and contents are maintained at substantially said predetermined temperature for a predetermined time period.

18. The method of claim 17, wherein:
said shaping mold and contents are cooled to a temperature level less than said predetermined temperature before opening said shaping mold to release said protective body.

19. The method of claim 18, including the steps of:
abrading outer faces of said protective body after release from said mold; and
fitting said abraded body into a pre-formed resinous shell.

20. The method of claim 19, wherein:
said abraded body is sealed in said resinous shell.

21. A method for encapsulating temperature sensitive electronic devices in a material having a high heat of fusion to form a heat sink around said electronic devices, comprising:
placing a predetermined quantity of said material in particulate form into a preform mold and heating said mold to a predetermined temperature sufficient to soften said material to a paste consistency, but below the melting temperature of the material;
compressing said material with a ram at a predetermined pressure while maintaining said preform mold at said predetermined temperature for a predetermined amount of time sufficient to form said particulate material into a substantially void-free preform slug within said preform mold;
thereafter removing said ram and closing said preform mold to provide a closed chamber for minimizing oxidation of said preform slug during subsequent baking;
subsequently baking said preform slug by placing said preform mold into a heated environment to maintain said mold at a predetermined temperature less than said melting temperature for an extended period of time sufficient to attain a substantially uniform temperature throughout said material; and
transferring said baked preform slug under pressure from a ram into a forming mold containing said electronic devices to flow said material into said forming mold around said electronic device to thereby encapsulate said electronic device in a substantially void-free encapsulation.

22. The method recited in claim 21, wherein said material is compressed in said preform mold with a ram force on the order of five to six tons at a temperature of on the order of 300° F. for approximately two to three minutes.

23. The method recited in claim 22, wherein said preform slug is baked in an oven at approximately 300° F. for approximately three hours.

24. The method recited in claim 23, wherein said preform slug is transferred into the forming mold at a ram force of approximately one-half ton over a time interval of approximately two to three minutes.

* * * * *